United States Patent [19]
Brown

[11] Patent Number: 5,260,170
[45] Date of Patent: Nov. 9, 1993

[54] DIELECTRIC LAYERED SEQUENTIALLY PROCESSED CIRCUIT BOARD

[75] Inventor: Vernon L. Brown, Barrington, Ill.

[73] Assignee: Motorola, Inc., Schaumburg, Ill.

[21] Appl. No.: 461,857

[22] Filed: Jan. 8, 1990

[51] Int. Cl.$^5$ ............................................. G03C 5/58
[52] U.S. Cl. .................................. 430/315; 430/312; 430/313; 430/317; 427/96
[58] Field of Search ............... 430/312, 315, 313, 316, 430/317, 319; 427/96

[56]  References Cited

U.S. PATENT DOCUMENTS

| | | | |
|---|---|---|---|
| 3,424,854 | 1/1969 | Baxter | 174/68.5 |
| 4,572,764 | 2/1986 | Fan | 430/315 |
| 4,737,446 | 4/1988 | Cohen et al. | 430/315 |
| 4,748,104 | 5/1988 | Ferrier et al. | 430/315 |
| 4,859,571 | 8/1989 | Cohen et al. | 430/311 |
| 4,902,610 | 2/1990 | Shipley | 430/315 |
| 4,910,072 | 3/1990 | Morgan et al. | 427/96 |
| 4,948,707 | 8/1990 | Johnson et al. | 430/315 |

OTHER PUBLICATIONS

Nakahara, "Penetration of Fully Additive CC-4 Boards in the Japanese Market", Electronic Packaging & Production, Apr. 1982.

Ohsaki, et al., "A Fine-Line Multilayer Substrate with Photo-Sensitive Polyimide Dielectric and Electroless Plated Conductors".

Moriya et al., "High-Density Multilayer Interconnection with Photo-Sensitive Polyimide Dielectric and Electroplating Conductor", IEEE 34th Electronic Components Conference May 1984, pp. 82–87.

Primary Examiner—Marion E. McCamish
Assistant Examiner—Janis L. Dote
Attorney, Agent, or Firm—Raymond A. Jenski

[57]  ABSTRACT

A dielectric layered sequentially processed circuit board is disclosed. A first photodefinable resin containing an electroless plating catalyst is disposed on a substrate and portions of the substrate are exposed through the first resin. A second photodefinable resin absent the electroless plating catalyst is disposed on the first resin, and portions coincident with the exposed portions of the substrate as well as portions of the first resin are exposed through the second resin. A conductive material is deposited on the exposed portions of the substrate and the exposed portions of the first resin.

4 Claims, 3 Drawing Sheets

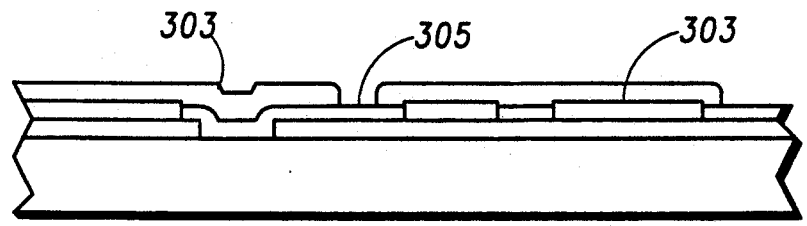
FIG.3b
FIG.3c
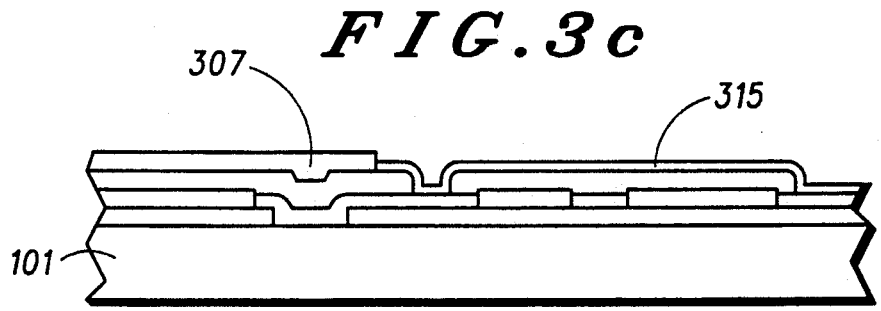
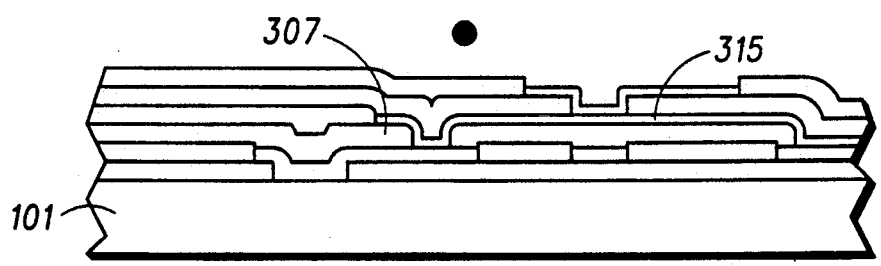
FIG.3d
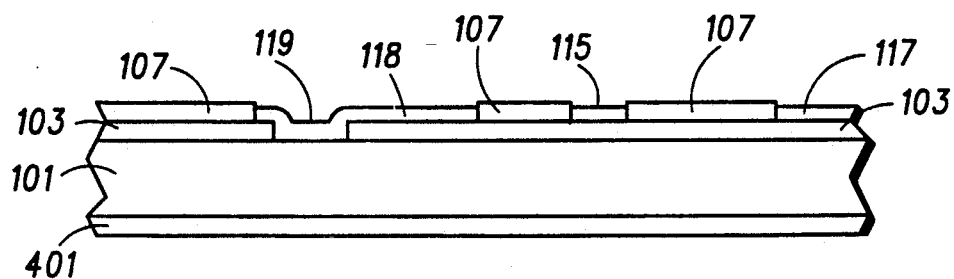
FIG.4

DIELECTRIC LAYERED SEQUENTIALLY PROCESSED CIRCUIT BOARD

BACKGROUND OF THE INVENTION

This invention relates generally to printed circuit boards and their fabrication and more particularly relates to a multistep all-additive approach to printed circuit board manufacture combined with the sequential use of catalyzed/noncatalyzed resins which are photo definable.

The fabrication of printed circuit boards is generally accomplished by one of two basic techniques. The first technique begins with a copper (or other conductive material) coated substrate and selectively removes the conductive material in accordance with a photo defined masking and etching process defined pattern and chemical etch. The second basic method utilizes the addition of conductive material by way of photodefined patterns to provide properly interconnected conductive runners.

In the construction of a sequentially processed multilayer printed wiring board, as opposed to a laminated multilayer board, each dielectric/conductor layer is applied by a sequence of processes which construct, first, the dielectric, then the vias or interlayer interconnection, then the conductive runners. One such process (process "A" herein) has been defined by Ohsaki et al., of NTT Electrical Communications Laboratories in a paper titled "A Fine-Line Multilayer Substrate with Photo-Sensitive Polyimide Dielectric and Electroless Copper Plated Conductors". A second process (process "B" herein) has been used by E. I. Du Pont de Nemoirs, Inc. Both of these processes use a combination of addition and etching of metals as well as addition and removal of applied dielectric to obtain both conductive runners and the dielectric with conductive holes (vias) which connect runners on one layer with runners above and below. Non-permanent photoresist is a common need of both processes. Processes A and B are typical processes. To provide a single interconnecting layer process "A" utilizes twenty-seven identifiable steps and process "B" utilizes twenty-eight identifiable steps. The useful polyimide circuit made by these processes and having four metal layers would require twenty-seven or twenty-eight steps repeated four times or a total of one hundred twelve steps in the case of process "B". A simpler material system which could reduce the cost by improving yield through process simplicity would be revolutionary. As an example, a four metal layer board with 25 $\mu$m to 50 $\mu$m lines and padless vias has the interconnectivity of a state of the art fine line laminated multi-layer board (MLB) using 125 $\mu$m lines in ten or twelve layers, but four times as large.

While the number of steps in the process "A" and process "B" are similar, the material used and methods of manufacture are entirely different. The process "A" uses photosensitive polyimide and wet chemical processes. Process "B" uses non-photosensitive polyimide with reactive ion etching of the polyimide. Many steps are required in both processes to attain conductor adhesion with polyimide. Process "B" is more costly because a large amount of time is required for the vacuum and ionic processes is required. Both processes are economically limited to line and film thicknesses of less than approximately 10 $\mu$m and a physical size of less than approximately 8.6 cm$^2$. Larger lines and thicknesses are often indicated by functional need.

Both processes, by nature of the resin used, have large variability of dielectric constant as a function of humidity. For example, a 25 $\mu$m film thickness and a 25 $\mu$m line produces a 50 ohm characteristic impedance transmission line at low humidity when $\epsilon=3.5$. The same printed circuit board transmission line would have 40 ohms characteristic impedance at high humidity, when $\epsilon=5.0$. Because of the high variability with humidity, electronic circuits realized on a printed circuit board using process "A" or process "B" are usually confined within a sealed package. Transmission line impedance levels higher than 50 ohms are difficult to achieve with the very thin dielectric layers possible with polyimide. Because of these limitations plus inherent manufacturing complexity, it is unlikely that sequential polyimide substrates such as those realized by process A or process B will achieve wide usage other than multi-chip packaging within a cover of a relatively small module.

SUMMARY OF THE INVENTION

Therefore, it is one object of the present invention to provide an improved and economically sound approach to constructing line printed circuit boards and multi-chip modules.

It is another object of the present invention to eliminate non-permanent photoresist operations.

It is another object of the present invention to eliminate electro-plating operations.

It is a further object of the present invention to eliminate long process time vacuum or gas processes.

Accordingly, the present invention encompasses a printed circuit board fabricated on a substrate by defining and developing a first image in a resin having an electroless plating catalyst, defining and developing a second image in a resin not having the electroless plating catalyst, and depositing a conductive material on exposed portions of the substrate and the resin having the electroless plating catalyst.

BRIEF DESCRIPTION OF THE DRAWINGS

FIGS. 3a-3d are cross-sections of the circuit board of FIG. 1a-1e illustrating further steps in the process of the present invention.

FIG. 4 is a cross-section of a printed circuit board similar to that shown in FIG. 1e and further having additive conductive layers on the bottom of the substrate in accordance with the present invention.

DETAILED DESCRIPTION OF THE PREFERRED EMBODIMENT

The invention disclosed herein is of a layered dielectric sequentially processed circuit board and the process utilized in making same. The printed circuit board construction described herein is intended to provide a lower cost and simpler circuit board than the multilayer sequential thin film circuits currently under development and in early field use by others. These printed circuit boards are sometimes referred to as multi-chip modules or thin film hybrids. They are generally limited to a small size and, while they can be used for line sizes well under 25 $\mu$m in width, they generally cannot be used for line widths greater than 25 μm because the process complexity and materials limitations for attaining sufficiently thick dielectric layers with multiple passes makes such attainment very difficult. The inventive process of the present invention, however, using epoxy or other resins, should be able to compete economically with conventional multi-layer circuit boards by trading more layers for finer interconnects and smaller vias. The process of the present invention will provide interconnects with lines and spaces between approximately 125 μm and 10 μm-the area of greatest interest in reducing interconnect lengths to obtain performance benefits in either a printed circuit board or multi-chip module.

Figure 1A:
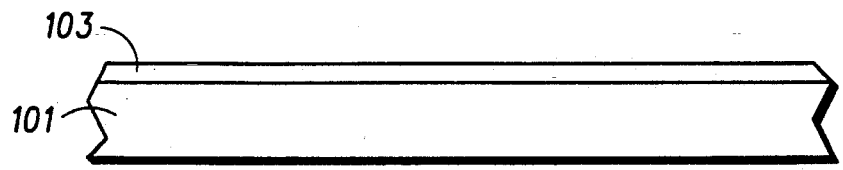
FIGS. 1a-1e are cross-sections of a printed circuit board employing a conductive substrate and utilizing the processes of the present invention.

Referring now to FIG. 1a, the substrate 101, shown in cross-section, is either: (a) a cast or molded insulating material or composite material such as a conventional (or fine line) printed circuit board or a thin film ceramic or a thick film ceramic substrate upon which printed wiring may be placed, or (b) a finished catalyzed surface, or (c), as in the preferred embodiment, a metal sheet, plate, casting, or other suitably finished conductive material which forms the electrical ground for the circuit and may act as the structural member and heat spreading as well. Substrate 101 may be selected for many different properties such as strength, formability, weight, temperature coefficient of expansion, and/or other physical or electrical properties.

In step 1 a polymer resin 103 is deposited on a surface of substrate 101. Resin 103 is a solid resin conventionally dissolved in a solvent or a 100% solid liquid resin. Resin 103 solids contain both a photo-sensitive group allowing selective removal of the resin (such as Probimer 61 resin from Ciba-Geigy, Inc.) and a catalytic filler (such as CAT-10 available from PCK, Inc.) which consists of small particles of under about 4 μm in diameter, having an adsorbed electroless plating catalyst such as palladium. These particles may also be of a reducible metal oxide such as cuprous oxide. Resin 103 is conventionally referred to as a catalyzed resin.

Figure 1B:
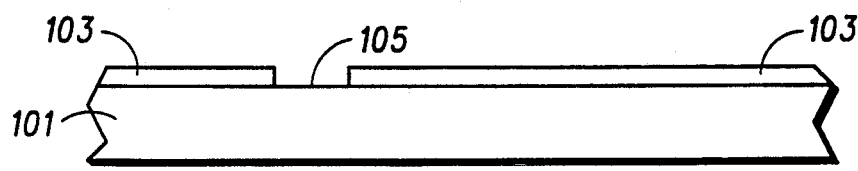

In FIG. 1b, a pattern is defined and developed in the resin 103, in the preferred embodiment. Resin 103 is exposed to light through a negative mask which leaves a hole (or via) 105 at points where a connection is desired to the conductor or conductor pattern of substrate 101. Resin 103 is subsequently cured by heat or other means to fix its mechanical, chemical, and photochemical properties.

Figure 1C:
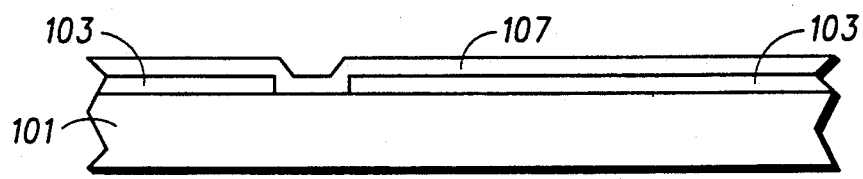

In FIG. 1c, representing the third step of the process, resin 107, uncatalyzed, is deposited over the cured catalyzed resin 103. Resin 107 is the same (or compatible) resin as resin 103 except that resin 107 contains no catalyst. Further, resin 107 is also photo-reactive. (Resin 103 and Resin 107 may be applied by the same or different methods and they may be applied in different thicknesses. Also, the substrate 101 may use a dielectric having a different dielectric constant from cured resins 103 and 107). Also resin 103 and resin 107 may have different dielectric constants and other different properties.

Figure 1D:
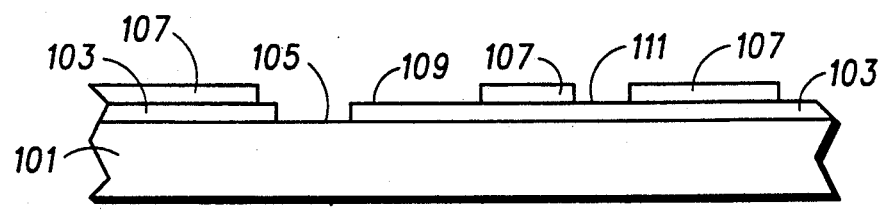

In the fourth step shown in FIG. 1d, openings 109, 111, and 113 (which may also include opening 105) are photodefined through a mask and developed in resin 107. These openings 109, 111, and 113, are the image of interconnect geometry in the additive metal layer and the vias which will connect the additive metal layer to the conductive pattern or surface of substrate 101 through opening 105 which will eventually connect the pattern to the substrate. Resin 107 is then cured.

As shown in 1e, a conductor such as copper is electrolessly deposited on the surface of cured resin 103 and the exposed surface of the conductive or catalytic portions of substrate 101 in the areas where openings have been photodefined through resin 103 (the via 105). The walls formed by openings 105, 109, 111 and 113 in resin 107 define the lines 115, 118 and 117 and via 119 to the precision of the definition of the uncatalyzed photo polymer resin 107. The walls formed by the opening defines the via to the precision of the catalyzed photo polymer resin. The printed circuit board shown in FIG. 1e defines a single dielectric and single interconnect layer, with connections to a conductive substrate or patterned layer below. Substrate 101 may be an insulator as well as a patterned or bulk conductive or surface conductive material. Substrate 101 may also be a different compatible catalyzed material.

Figure 1E:
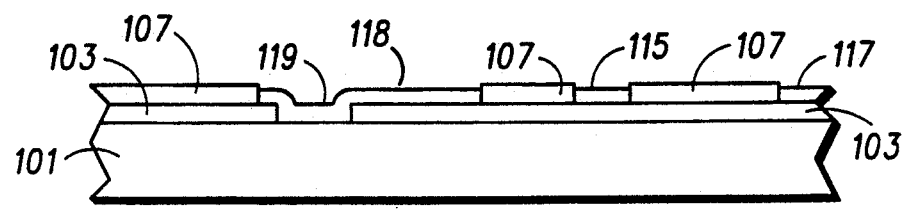
Figure 2:
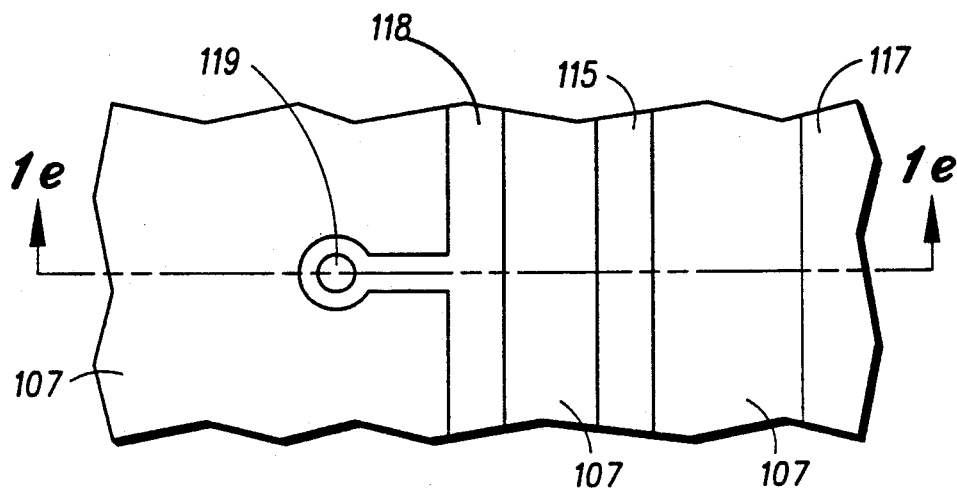
FIG. 2 is a diagram of the top surface of a printed circuit board indicating the cutting plane which results in FIG. 1e.

The top surface of a printed circuit board which is produced in accordance with the additive steps shown in FIGS. 1a through 1e is shown in FIG. 2. The cured resin 107 with lines 115, 117 and 118 and via 119 forms the visible surface of the first interconnect layer of the circuit board.

FIG. 2 may become the starting point for additional layering in which the configuration disclosed by FIG. 1e becomes, itself, the substrate 101 of FIG. 1a.

Figure 3A:
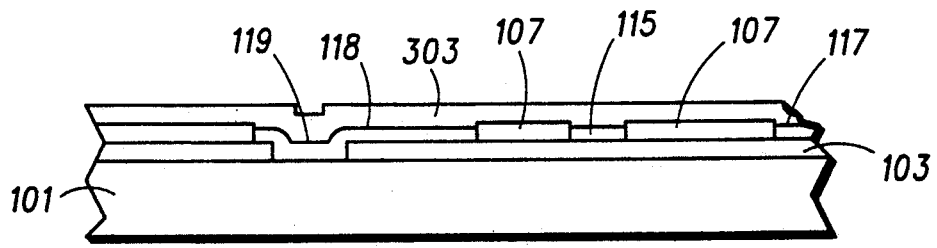

Referring now to FIGS. 3a-3c, a continuing process of additive layers is shown. Resin 303 catalyzed which is substantially the same resin as resin 103 is deposited on the surface of cured resin 107, defined pattern 117, 115 and 118 and defined via 119, as shown in FIG. 3a.

In FIG. 3b resin 303 is exposed to light through a negative mask and a pattern is generated which leaves a hole (or via) 305 at points where a connection is desired to the conductor pattern 117. Resin 303 is subsequently cured by heat or other means to fix its mechanical, photochemical, and chemical properties.

In FIG. 3c resin 307 uncatalyzed is deposited over the cured catalyzed resin 303. Resin 307 is substantially the same as uncatalyzed resin 107 and is applied in substantially the same way as in 1c. In FIG. 3c, a second conductor, such as copper, is electrolessly deposited on the exposed surface of cured resin 303 and hole 305 as in FIG. 1e. Likewise, additional layers may be constructed, providing additional conductor patterns, such as metal trace 315, with vias to other layers as necessary. The printed circuit board shown in FIG. 3d defines two interconnected circuit layers which are also connected to patterned or surface conductive substrate 101. Each layer is separated by dielectric from others.

The circuit of 1e or 3d may have an additional layer of uncatalyzed resin 107(307) applied as defined over metal traces 117. 315 to insulate and protect them in use or any number of additional layers which may be desired. Exposed metal areas required for solder attachment of components, or pressure connection are protected by a suitable inert surface consisting of, for example, nickel followed by immersion or electroless gold plating.

Depending on the desired board type, the present invention can be realized from alternative starting points. For example, substrate 101 may be a double-sided circuit having ground and/or power interconnects on the bottom surface of substrate 101 and an etched pattern on the top surface of substrate 101, as shown in FIG. 4. This alternative approach utilizing the steps outlined in FIGS. 1a through 1e may be used to produce a multiple signal layer board with a ground plane in which both signal planes would be referenced to a single ground plane. The dielectric of the substrate could be a high quality radio frequency dielectric, for example, with resin layers 103 and 401 being very thin, contributing little degradation to the overall radio frequency performance of the circuit.

Substrate 101 may be a catalyzed dielectric such as molded or cast plastic with or without holes between top and bottom surfaces. In this way the plastic could be the structure of an electronic enclosure in which an electromagnetic shield is provided simultaneously with the circuit.

Therefore, a layered dielectric sequentially processed circuit board has been shown and described. While a particular embodiment of the invention has been described and shown, it should be understood that the invention is not limited thereto since many modifications may be made by those skilled in the art. It is therefore contemplated to cover any and all such modifications that fall within the true spirit and scope of the basic underlying principles disclosed and claimed herein.

I claim:

1. A method for fabricating an additive process printed circuit comprising the steps of:
    applying a first photodefinable resin containing an electroless plating catalyst to a substrate surface;
    defining and developing a first image in said first photodefinable resin whereby portions of said substrate surface are exposed;
    applying a second photodefinable resin which does not contain an electroless plating catalyst to said first photodefinable resin and said exposed portions of said substrate surface;
    defining and developing a second image in said second photodefinable resin in portions at least partially coincident with said first image whereby at least portions of said exposed portions of said substrate surface are reexposed; and
    depositing a conductive material on said reexposed portions of said substrate surface and on said first photodefinable resin coincident with said second image.

2. A method in accordance with the method of claim 1 wherein said step of defining and developing a second image further comprises the step of defining and developing said second image in said second photodefinable resin in portions which are not at least partially coincident with said first image.

3. A method in accordance with the method of claim 1 further comprising the steps of:
    applying a third photodefinable resin containing an electroless plating catalyst to said deposited conductive material and said second photodefinable resin;
    defining and developing a third image in said third photodefinable resin whereby portions of said deposited conductive material are exposed;
    applying a fourth photodefinable resin which does not contain an electroless plating catalyst to said third photodefinable resin and said exposed portions of said deposited conductive material;
    defining and developing a fourth image in said fourth photodefinable resin in portions at least partially coincident with said third image whereby at least portions of said exposed portions of said deposited conductive material and said third photodefinable resin are reexposed; and
    depositing a conductive material on said reexposed portions of said deposited conductive material and said third photodefinable resin coincident with said fourth image.

4. A method in accordance with the method of claim 1 further comprising the step of applying a third resin to a second surface of said substrate.

* * * * *